US008614447B2

(12) United States Patent
Hekmatshoartabari et al.

(10) Patent No.: US 8,614,447 B2
(45) Date of Patent: Dec. 24, 2013

(54) SEMICONDUCTOR SUBSTRATES USING BANDGAP MATERIAL BETWEEN III-V CHANNEL MATERIAL AND INSULATOR LAYER

(75) Inventors: Bahman Hekmatshoartabari, White Plains, NY (US); Devendra K. Sadana, Pleasantville, NY (US); Ghavam G. Shahidi, Pound Ridge, NY (US); Davood Shahrjerdi, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/361,004

(22) Filed: Jan. 30, 2012

(65) Prior Publication Data

US 2013/0193441 A1 Aug. 1, 2013

(51) Int. Cl.
H01L 21/20 (2006.01)
(52) U.S. Cl.
USPC .......................................... 257/76
(58) Field of Classification Search
USPC ............... 257/76, E29.089, E21.09; 438/478
See application file for complete search history.

(56) References Cited

U.S. PATENT DOCUMENTS

| | | | | |
|---|---|---|---|---|
| 4,839,702 | A * | 6/1989 | Grinberg et al. | 257/23 |
| 6,498,360 | B1 * | 12/2002 | Jain et al. | 257/194 |
| 6,953,954 | B2 * | 10/2005 | Yoshii et al. | 257/194 |
| 7,170,111 | B2 * | 1/2007 | Saxler | 257/194 |
| 7,351,995 | B2 * | 4/2008 | Hsu et al. | 257/20 |
| 7,442,953 | B2 * | 10/2008 | Augusto | 257/21 |
| 7,544,963 | B2 * | 6/2009 | Saxler | 257/20 |
| 7,564,074 | B2 * | 7/2009 | Sadaka et al. | 257/194 |
| 7,612,390 | B2 * | 11/2009 | Saxler et al. | 257/194 |
| 7,642,568 | B2 * | 1/2010 | Brar et al. | 257/194 |
| 7,655,963 | B2 * | 2/2010 | Sadaka et al. | 257/194 |
| 7,675,056 | B2 * | 3/2010 | Lee et al. | 257/20 |
| 7,932,539 | B2 * | 4/2011 | Chen et al. | 257/194 |
| 8,076,699 | B2 * | 12/2011 | Chen et al. | 257/194 |
| 2001/0002706 | A1 * | 6/2001 | Hase et al. | 257/192 |
| 2003/0010999 | A1 * | 1/2003 | Tanabe | 257/194 |
| 2003/0020092 | A1 * | 1/2003 | Parikh et al. | 257/192 |

(Continued)

FOREIGN PATENT DOCUMENTS

WO    WO0079599    12/2000

OTHER PUBLICATIONS

S. Goto, T. Ueda, T. Ohshima and H. Kakinuma, May 1998 Tsukuba, Japan, Effect of growth conditions on Si doping into InAlAs grown by metal-organic vapor phase epitaxy p. 119-122, 10th Intern. Conf. on Indium Phosphide and Related Materials 11-15.*

(Continued)

Primary Examiner — Thao Le
(74) Attorney, Agent, or Firm — Ryan, Mason & Lewis, LLP

(57) ABSTRACT

Improved semiconductor substrates are provided that employ a wide bandgap material between the channel and the insulator. A semiconductor substrate comprises a channel layer comprised of a III-V material; an insulator layer; and a wide bandgap material between the channel layer and the insulator layer, wherein a conduction band offset ($\Delta E_c$) between the channel layer and the wide bandgap material is between 0.05 eV and 0.8 eV. The channel layer can be comprised of, for example, $In_{1-x}Ga_xAs$ or $In_{1-x}Ga_xSb$, with x varying from 0 to 1. The wide bandgap material can be comprised of, for example, $In_{1-y}Al_yAs$, $In_{1-y}Al_yP$, $Al_{1-y}Ga_yAs$ or $In_{1-y}Ga_yP$, with y varying from 0 to 1.

12 Claims, 2 Drawing Sheets

(56) References Cited

U.S. PATENT DOCUMENTS

| | | |
|---|---|---|
| 2004/0135169 A1 | 7/2004 | Yoshii et al. |
| 2004/0262632 A1* | 12/2004 | Marsh et al. .................. 257/194 |
| 2006/0076577 A1 | 4/2006 | Boos et al. |
| 2006/0267007 A1 | 11/2006 | Salzman et al. |
| 2007/0252223 A1* | 11/2007 | Lee et al. ...................... 257/411 |
| 2007/0278519 A1* | 12/2007 | Baudet et al. ................. 257/192 |
| 2008/0203478 A1* | 8/2008 | Prikhodko et al. ............ 257/347 |
| 2008/0296622 A1* | 12/2008 | Kiewra et al. ................. 257/194 |
| 2010/0117062 A1* | 5/2010 | Hudait et al. .................. 257/24 |
| 2011/0127545 A1* | 6/2011 | Makiyama et al. ............. 257/77 |
| 2011/0147706 A1* | 6/2011 | Radosavljevic et al. ........ 257/18 |
| 2011/0147708 A1* | 6/2011 | Radosavljevic et al. ........ 257/24 |
| 2011/0147712 A1* | 6/2011 | Radosavljevic et al. ........ 257/24 |
| 2011/0147762 A1* | 6/2011 | Sheppard ........................ 257/76 |
| 2012/0292665 A1* | 11/2012 | Marino et al. ................. 257/194 |

OTHER PUBLICATIONS

Yokoyama et al., "Extremely-Thin-Body InGaAs-ON-Insulator MOSFETs on Si Fabricated by Direct Wafer Bonding", IEDM technical Digest, pp. 46-49, 2010.

S. H. Kim, "High-performance extremely thin body III-V on insulator MOSFETs on a Si substrate with Ni-InGaAs metal S/D and MOS interface buffer engineering", VLSI Technical Digest, pp. 58-58, 2011.

* cited by examiner

SEMICONDUCTOR SUBSTRATES USING BANDGAP MATERIAL BETWEEN III-V CHANNEL MATERIAL AND INSULATOR LAYER

FIELD OF THE INVENTION

The present invention relates generally to semiconductor devices, and, more particularly, to semiconductor devices employing III-V channel materials.

BACKGROUND OF THE INVENTION

High-mobility channel materials, such as III-V materials, have been proposed as alternatives to replace Silicon as the channel material for complementary metal-oxide-semiconductor (CMOS) applications, due to their intrinsic high electron mobility. Semiconductor substrates comprised of an extremely thin III-V material on an insulator, for example, have been identified as a promising substrate for making field-effect transistors (FETs) with improved scaling, while also offering improved electrostatic behavior over bulk counterparts.

The proper surface passivation of III-V materials, however, has been recognized as an overriding challenge in realizing high-performance inversion-type III-V FETs. The high density of charge traps at the interface between the insulator layer and the III-V material can result in significant degradation of carrier transport in the channel. In addition, the reduction of carrier density in the channel due to charge trapping can also result in significant degradation of drive current.

S. H. Kim et al., "High Performance Extremely-Thin Body III-V-on-Insulator MOSFETs on a Si Substrate with Ni—InGaAs Metal S/D and MOS Interface Buffer Engineering," IEEE Symp. on VLSI Technology (VLSIT) (2011), proposes the insertion of a buffer layer comprised of Indium Gallium Arsenide (InGaAs) in between the channel and the insulator. The disclosed technique employs an InGaAs buffer layer with a lower Indium content than that of the InGaAs channel to confine electron carriers in the channel. The employed buffer layer, however, does not have a sufficiently large conduction band offset with the conduction band of the channel material to repel electrons.

A need therefore remains for improved semiconductor substrates employing a wide bandgap material between the channel and the insulator. Yet another need exists for the employed wide bandgap material to provide a sufficiently large conduction band offset with the conduction band of the channel material to repel electrons. Although III-V channel materials offer high electron mobility, their relatively low effective conduction band density of states will have a negative impact on the inversion charge density and the resulting drive current. Therefore, a device structure is also needed that can circumvent this low effective conduction band density problem as well.

SUMMARY OF THE INVENTION

Generally, improved semiconductor substrates are provided that employ a wide bandgap material between the channel and the insulator. According to one aspect of the invention, a semiconductor substrate comprises a channel layer comprised of a III-V material; an insulator layer; and a wide bandgap material between the channel layer and the insulator layer, wherein a conduction band offset ($\Delta E_c$) between the channel layer and the wide bandgap material is between 0.05 eV and 0.8 eV. The channel layer can be comprised of, for example, $In_{1-x}Ga_xAs$ or $In_{1-x}Ga_xSb$, with x varying from 0 to 1. The wide bandgap material can be comprised of, for example, $In_{1-y}Al_yAs$, $In_{1-y}Al_yP$, $Al_{1-y}Ga_yAs$ or $In_{1-y}Ga_yP$, with y varying from 0 to 1.

Generally, the conduction band offset ($\Delta Ec$) is sufficient to repel electrons. In one particular implementation, the conduction band offset ($\Delta E_c$) between the channel layer and the wide bandgap material is between 0.1 eV and 0.6 eV. In one variation, the wide bandgap material further comprises an embedded Si delta-doping ($\delta$-doping) material that provides electron carriers into the channel layer.

A more complete understanding of the present invention, as well as further features and advantages of the present invention, will be obtained by reference to the following detailed description and drawings.

DETAILED DESCRIPTION OF PREFERRED EMBODIMENTS

The present invention provides improved semiconductor devices employing a wide bandgap material between the channel and the insulator and an optional Si delta-doping ($\delta$-doping) embedded in the wide bandgap material that can provide sufficient electron carriers into the channel to circumvent the issue with low effective conduction band density of states. According to one aspect of the invention, the employed wide bandgap material provides a sufficiently large conduction band offset with the conduction band of the channel material to repel electrons.

Figure 1:
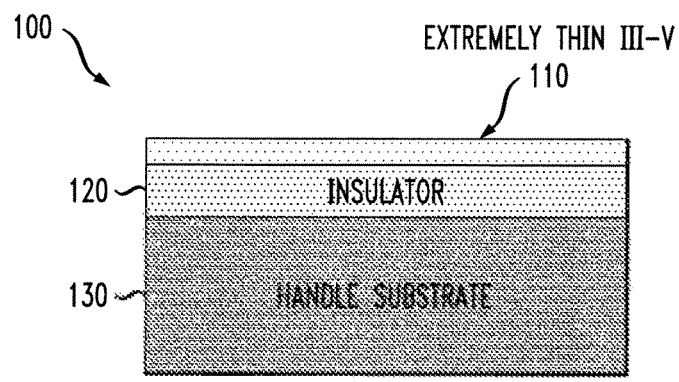
FIG. 1 is a cross-sectional illustration of a conventional semiconductor substrate.

FIG. 1 is a cross-sectional illustration of a conventional semiconductor substrate 100. As shown in FIG. 1, the exemplary semiconductor substrate 100 is comprised of an extremely thin III-V material 110 on an insulator 120. As indicated above, the semiconductor substrate 100 shown in FIG. 1 has been identified as a promising substrate for making FETs with improved scaling and improved electrostatic behavior over bulk counterparts. A handle substrate 130 can be any arbitrary material, in a known manner. In CMOS technology, however, the typical substrate is Si and the handle substrate 130 is thus typically expected to be Si.

Figure 2:
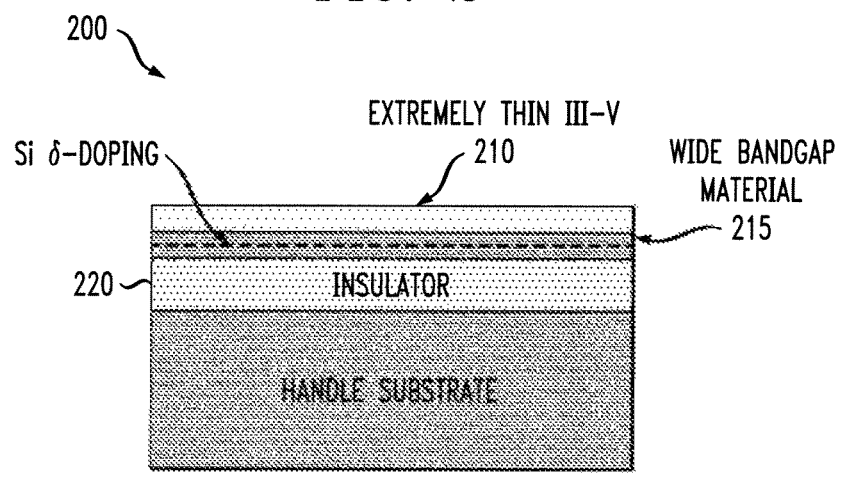
FIG. 2 is a cross-sectional illustration of a semiconductor substrate in accordance with the present invention.

FIG. 2 is a cross-sectional illustration of a semiconductor substrate 200 in accordance with the present invention. As shown in FIG. 2, the exemplary semiconductor substrate 200 is comprised of an extremely thin III-V material 210 and an insulator 220, similar to FIG. 1. In addition, the exemplary semiconductor substrate 200 employs a wide bandgap material 215 between the extremely thin III-V channel material 210 and the insulator 220.

The III-V channel material 210 can be, for example, $In_{1-x}Ga_xAs$ and $In_{1-x}Ga_xSb$ with x varying from 0 to 1. The wide bandgap material 215 can be $In_{1-y}Al_yAs$, $In_{1-y}Al_yP$, $Al_{1-y}Ga_yAs$ and $In_{1-y}Ga_yP$ with y varying from 0 to 1. Additionally, the wide bandgap material 215 can be unintentionally doped, heavily-doped p-type or semi-insulating. One of the advantages of the present invention is to relax the requirements for the bottom insulator 220.

The present invention recognizes that a relatively large conduction band offset ($\Delta E_c$) is necessary between the extremely thin III-V channel material 210 and the wide band gap material 215.

Figure 3:
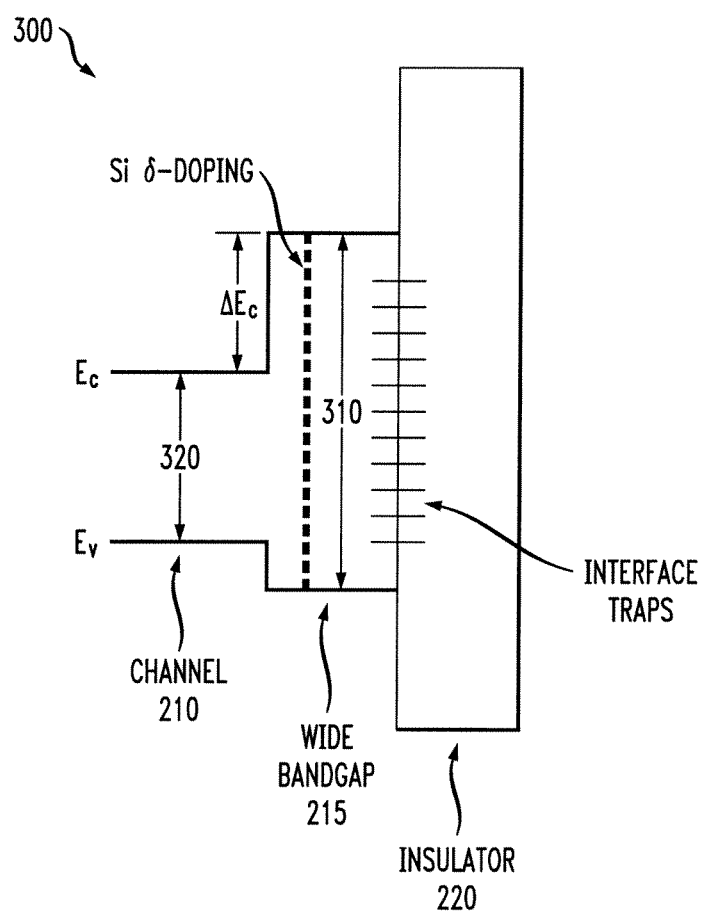
FIG. 3 illustrates the conduction band offset, $\Delta E_c$, for the semiconductor substrate of FIG. 2.

FIG. 3 illustrates the conduction band offset, $\Delta E_c$, 300 for the semiconductor substrate 200 of FIG. 2. As indicated above, the conduction band 310 of the wide bandgap material 215 should provide a sufficiently large conduction band offset with the conduction band 320 of the III-V channel material 210.

It is noted that the conduction band ($E_c$) is the range of electron energies, higher than that of the valence band ($E_v$), sufficient to free an electron from binding with its individual atom and allow it to move freely within the atomic lattice of the material. Electrons within the conduction band ($E_c$) are mobile charge carriers in solids, responsible for conduction of electric currents.

The present invention recognizes that free electrons are above the conduction band ($E_c$). Therefore, a relatively large conduction band offset ($\Delta E_c$) is desired. The desired conduction band offset ($\Delta E_c$) is obtained in accordance with an aspect of the present invention by selecting an appropriate wideband gap material 215 for a given channel material 210. As discussed hereinafter, an appropriate wideband gap material 215 is selected for a given channel material 210 to provide a sufficiently large conduction band offset ($\Delta E_c$) to repel electrons from the bottom of the channel 210. The broad conduction band offset ($\Delta E_c$) is between 0.05 eV and 0.8 eV and the narrow desired range is between 0.1-0.6 eV.

Among other benefits, the insertion of a wide bandgap material between the channel and the insulator provides a significant reduction of surface recombination velocity at the bottom interface with negligible penalty in short-channel effects. Additionally, increasing the conduction band offset will allow the use of a thinner buffer layer, thereby improving the short-channel effects.

The foregoing description discloses only exemplary embodiments of the invention. Modifications of the above disclosed structures and method which fall within the scope of the invention will be readily apparent to those of ordinary skill in the art. Accordingly, while the present invention has been disclosed in connection with exemplary embodiments thereof, it should be understood that other embodiments may fall within the spirit and scope of the invention, as defined by the following claims.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A semiconductor substrate comprising:
   a channel layer comprised of a III-V material;
   an insulator layer; and
   a wide bandgap material between said channel layer and said insulator layer and directly on said insulator layer, wherein a conduction band offset ($\Delta E_c$) between said channel layer and said wide bandgap material is between 0.05 eV and 0.8 eV.

2. The semiconductor substrate of claim 1, wherein said channel layer is comprised of one or more of $In_{1-x}Ga_xAs$ and $In_{1-x}Ga_xSb$ with x varying from 0 to 1.

3. The semiconductor substrate of claim 1, wherein said wide bandgap material is comprised of one or more of $In_{1-y}Al_yAs$, $In_{1-y}Al_yP$, $Al_{1-y}Ga_yAs$ and $In_{1-y}Ga_yP$ with y varying from 0 to 1.

4. The semiconductor substrate of claim 1, wherein said wide bandgap material is one or more of a heavily-doped p-type, unintentionally doped and semi-insulating material.

5. The semiconductor substrate of claim 1, wherein said conduction band offset ($\Delta E_c$) is sufficient to repel electrons.

6. The semiconductor substrate of claim 1, wherein said conduction band offset ($\Delta E_c$) between said channel layer and said wide bandgap material is between 0.1 eV and 0.6 eV.

7. The semiconductor substrate of claim 1, wherein said wide bandgap material further comprises an embedded Si delta-doping ($\delta$-doping) material.

8. The semiconductor substrate of claim 7, wherein said embedded Si delta-doping ($\delta$-doping) material provides electron carriers into said channel layer.

9. An integrated circuit, comprising:
   a semiconductor substrate, wherein said semiconductor substrate further comprises:
   a channel layer comprised of a III-V material;
   an insulator layer; and
   a wide bandgap material between said channel layer and said insulator layer and directly on said insulator layer, wherein a conduction band offset ($\Delta E_c$) between said channel layer and said wide bandgap material is between 0.05 eV and 0.8 eV.

10. The integrated circuit of claim 9, wherein said wide bandgap material is comprised of one or more of $In_{1-y}Al_yAs$, $In_{1-y}Al_{1-y}Ga_yAs$ and $In_{1-y}Ga_yP$ with y varying from 0 to 1.

11. The integrated circuit of claim 9, wherein said conduction band offset ($\Delta E_c$) between said channel layer and said wide bandgap material is between 0.1 eV and 0.6 eV.

12. The integrated circuit of claim 9, wherein said wide bandgap material further comprises an embedded Si delta-doping ($\delta$-doping) material.

* * * * *